(12) United States Patent
Hartwell et al.

(10) Patent No.: US 6,920,516 B2
(45) Date of Patent: Jul. 19, 2005

(54) ANTI-STARVATION INTERRUPT PROTOCOL

(75) Inventors: David W. Hartwell, Bolton, MA (US); Samuel H. Duncan, Arlington, MA (US); David T. Mayo, Boxboro, MA (US); David J. Golden, Woonsocket, RI (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 457 days.

(21) Appl. No.: 09/944,516

(22) Filed: Aug. 31, 2001

(65) Prior Publication Data

US 2002/0042856 A1 Apr. 11, 2002

Related U.S. Application Data

(60) Provisional application No. 60/229,830, filed on Aug. 31, 2000.

(51) Int. Cl.$^7$ ............................................... G06F 13/24
(52) U.S. Cl. ........................ 710/263; 710/263; 710/262; 710/266
(58) Field of Search ................................ 710/260–267; 170/266

(56) References Cited

U.S. PATENT DOCUMENTS

| | | | | |
|---|---|---|---|---|
| 5,325,536 A | * | 6/1994 | Chang et al. ................ | 710/263 |
| 5,379,428 A | * | 1/1995 | Belo .......................... | 718/103 |
| 5,452,452 A | * | 9/1995 | Gaetner et al. ............. | 718/103 |
| 5,504,894 A | * | 4/1996 | Ferguson et al. ............. | 707/2 |
| 5,579,525 A | * | 11/1996 | Suzuki ....................... | 710/260 |
| 5,606,703 A | * | 2/1997 | Brady et al. ................ | 710/264 |
| 5,754,866 A | * | 5/1998 | Priem ......................... | 710/260 |
| 5,819,112 A | * | 10/1998 | Kusters ....................... | 710/36 |
| 5,875,341 A | | 2/1999 | Blank et al. | |
| 5,875,343 A | * | 2/1999 | Binford et al. ............. | 710/263 |
| 5,881,296 A | | 3/1999 | Williams et al. | |
| 5,913,045 A | | 6/1999 | Gillespie et al. | |

(Continued)

OTHER PUBLICATIONS

James Peterson and Abraham Silberschatz, "Operating System Concepts", 1985, Addison Westley inc., vol. 2, pp. 120–122.*

Hwa–Chun Lin, Ge–Ming Chiu, and C.S. Raghavendra, "Performance Study of Dynamic Load Balancing Policies for Distributed Systems with Service Interruptions", 1991, IEEE.*

(Continued)

*Primary Examiner*—Sumati Lefkowitz
*Assistant Examiner*—Justin King

(57) ABSTRACT

An anti-starvation interrupt protocol for use in avoiding livelock in a multiprocessor computer system is provided. At least one processor is configured to include first and second control status registers (CSRs). The first CSR buffers information, such as interrupts, received by the processor, while the second CSR keeps track of the priority level of the interrupts. When an interrupt controller receives an interrupt, it issues a write transaction to the first CSR at the processor. If the first CSR has room to accept the write transaction, the processor returns an acknowledgement, whereas if the first CSR is already full, the processor returns a no acknowledgment. In response to a no acknowledgment, the interrupt controller increments an interrupt starvation counter, and checks to see whether the counter exceeds a threshold. If not, the interrupt controller waits a preset time and reposts the write transaction. If it does, the interrupt controller issues a write transaction having a higher priority to the second CSR. In response, the processor copies all of the pending interrupts from the first CSR into the memory subsystem, thereby freeing up the first CSR to accept additional write transactions.

20 Claims, 7 Drawing Sheets

U.S. PATENT DOCUMENTS

| | | | | |
|---|---|---|---|---|
| 5,931,936 A | * | 8/1999 | Chung et al. | 710/263 |
| 5,933,613 A | | 8/1999 | Tanaka et al. | |
| 6,021,456 A | | 2/2000 | Herdeg et al. | |
| 6,035,376 A | | 3/2000 | James | |
| 6,078,997 A | | 6/2000 | Young et al. | |
| 6,085,279 A | | 7/2000 | Suzuki | |
| 6,105,085 A | * | 8/2000 | Farley | 710/41 |
| 6,260,100 B1 | * | 7/2001 | Kessler | 710/260 |
| 6,389,526 B1 | | 5/2002 | Keller et al. | |
| 6,442,631 B1 | * | 8/2002 | Neufeld et al. | 710/107 |
| 6,480,918 B1 | * | 11/2002 | McKenney et al. | 710/200 |
| 6,532,501 B1 | * | 3/2003 | McCracken | 710/52 |
| 6,629,252 B1 | * | 9/2003 | Gholami et al. | 713/401 |

OTHER PUBLICATIONS

Interfacing the PC, Quality Information in one Place . . . , http://www.beyondlogic.org/interrupts/interrupt.htm, pp. 1–18.

An Introduction to Interrupts, http://goforit.unk.edu/asm/ints__.htm, (co) 1988–2000, pp. 1–14.

* cited by examiner

ANTI-STARVATION INTERRUPT PROTOCOL

CROSS-REFERENCE TO RELATED APPLICATIONS

The present invention is also related to U.S. Patent Application Ser. No. 09/867,138, which was filed on May 29, 2001 by Stephen Van Doren, Chester Pawlowski and Barry Maskas for a METHOD AND APPARATUS FOR DELIVERING ERROR INTERRUPTS TO A PROCESSOR OF A MULTIPLEPROCESSOR SYSTEM, and published on Mar. 7, 2002 as Published Application No. US 2002-0029358, which is also hereby incorporated by reference in its entirety.

BACKGROUND OF THE INVENTION

1. Field of the Invention

This invention relates to multiprocessor computer architectures and, more specifically, to the handling and processing of interrupts by multiprocessor computer systems.

2. Background Information

Distributed shared memory computer systems, such as symmetrical multiprocessor (SMP) systems, support high performance application processing. Conventional SMP systems include a plurality of processors coupled together by a bus. One characteristic of SMP systems is that memory space is typically shared among all of the processors. That is, each processor accesses programs and data in the shared memory, and processors communicate with each other via that memory (e.g., through messages and status information left in shared address spaces). In some SMP systems, the processors may also be able to exchange signals directly. One or more operating systems are typically stored in the shared memory. These operating systems control the distribution of processes or threads among the various processors. The operating system kernels may execute on any processor, and may even execute in parallel. By allowing many different processors to execute different processes or threads simultaneously, the execution speed of a given application may be greatly increased.

High-performance, multiprocessor computer systems often include large numbers of I/O devices. As indicated above, these I/O devices issue interrupts requiring servicing by a processor. Often, the interrupts generated by many I/O devices are directed to the same processor for servicing. During high or bursty I/O usage conditions, the large number of I/O interrupts being issued can overwhelm the processor's resources. This can result in a livelock condition whereby one or more I/O devices do not get serviced in a fair or reasonable manner. As a result, the operating system may crash.

One solution to this problem is to employ hardware that detects when an entity or agent of the computer system, such as an I/O device, is being starved for a resource of the system. When this condition is detected, the hardware causes a global signal to be sent to most if not all of the system's entities or agents preventing them from initiating any new transactions. Once the entity or agent that triggered the global signal completes its operation or receives the desired resources, the global signal is withdrawn and normal operation resumes. This approach, however, is very difficult to implement in large, high-performance multiprocessor systems. In can also substantially degrade the system's performance.

Alternatively, the number of entities or agents, such as I/O devices, that contend for a particular system resource, such as interrupt servicing, can be physically limited. This solution, however, limits the usefulness of the computer system as well as its performance.

SUMMARY OF THE INVENTION

Briefly, the invention is directed to an anti-starvation interrupt protocol for use in avoiding livelock in a multiprocessor computer system. The computer system includes a plurality of processors, a memory subsystem, a plurality of input/output (I/O) devices, each of which is capable of issuing interrupts, and an interrupt controller. The interrupt controller receives the interrupts from the I/O devices, which may be level sensitive interrupts (LSIs) or message signaled interrupts (MSIs). The interrupt controller may also receive interrupts generated by the processors. The interrupt controller is operatively coupled to an interrupt starvation counter which it uses to keep track of the processing of interrupts generated by the I/O devices and by the processors. In accordance with the present invention, at least one processor, the "target" processor, of the multiprocessor system is configured to include first and second control status registers (CSRs). The first CSR buffers information, such as interrupts, received by the processor, while the second CSR keeps track of the priority level of the information received by the processor.

When the interrupt controller receives an interrupt from a given I/O device or processor, it issues a write transaction to the first CSR at the target processor. If the first CSR has room to accept the write transaction (i.e., there is a free entry), the write transaction is stored at the free entry and the target processor issues an acknowledgement to the interrupt controller. The target processor then discharges the interrupt. If the first CSR is full and thus cannot accept a write transaction from the interrupt controller, the target processor returns a no acknowledgment to the interrupt controller. In response to a no acknowledgment, the interrupt controller increments its interrupt starvation counter, and checks to see whether the counter exceeds a predetermined threshold. If not, the interrupt controller waits a preset time and reposts the write transaction to the target processor. If the interrupt starvation counter exceeds the threshold, the interrupt controller issues a write transaction to the second CSR, thereby notifying the target processor of an interrupt starvation event. In response, the target processor copies all of the pending interrupts from the first CSR into the memory subsystem, thereby freeing up the first CSR to accept additional write transactions. The target processor then proceeds to discharge the interrupts that were copied into the memory subsystem.

BRIEF DESCRIPTION OF THE DRAWINGS

The invention description below refers to the accompanying drawings, of which.

DETAILED DESCRIPTION OF AN ILLUSTRATIVE EMBODIMENTS

Figure 1:
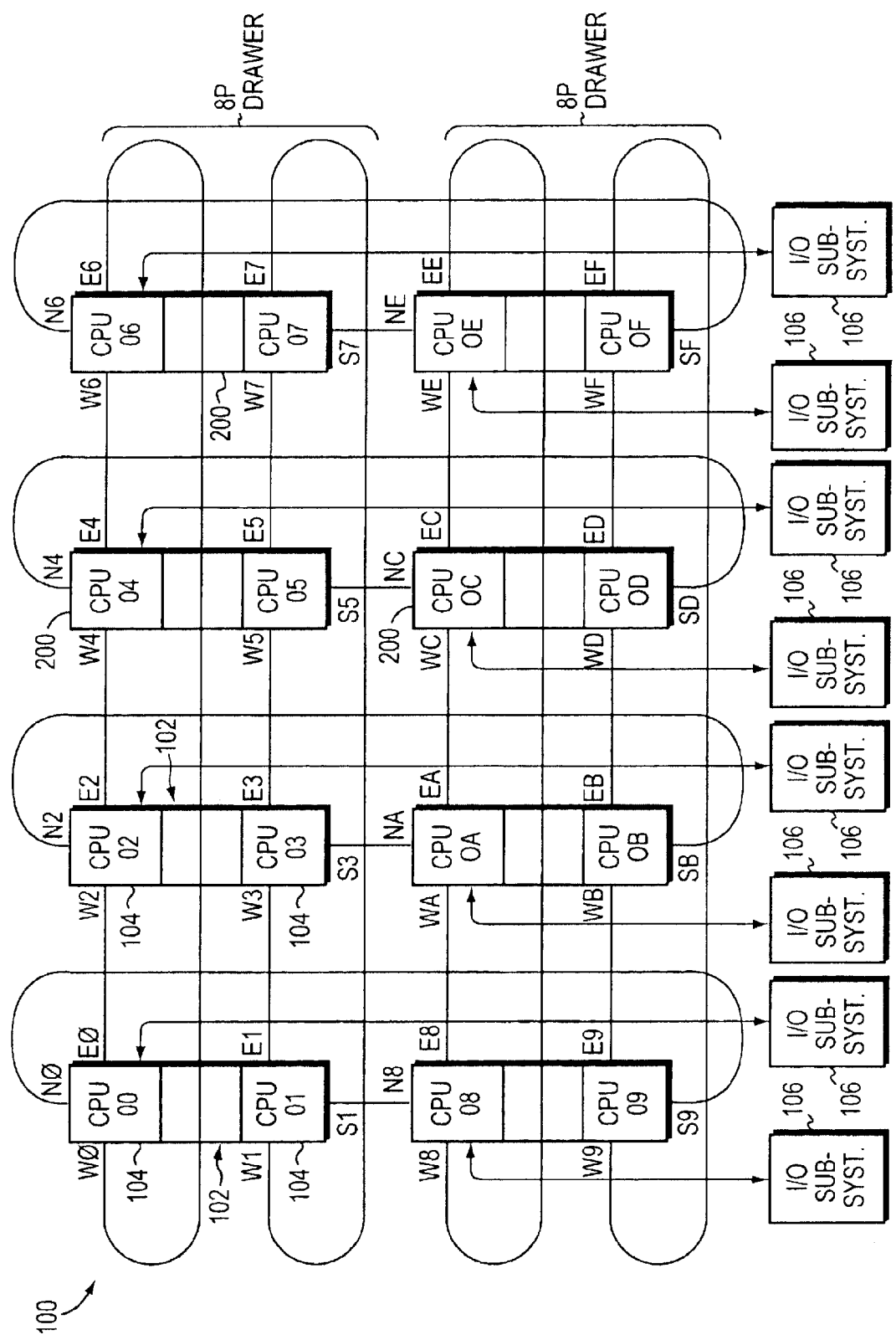
FIG. 1 is a schematic block diagram of a symmetrical multiprocessor computer system in accordance with the present invention.

FIG. 1 is a schematic block diagram of a symmetrical multiprocessor (SMP) system 100 comprising a plurality of processor modules 102 interconnected to form a two dimensional (2D) torus or mesh configuration. Each processor module 102 preferably comprises two central processing units (CPUs) or processors 104 and has connections for two input/output I/O ports (one for each processor 104) and six inter-processor (IP) network ports. The IP network ports are preferably referred to as North (N), South (S), East (E) and West (W) compass points and connect to two unidirectional links. The North-South (NS) and East-West (EW) compass point connections create a (Manhattan) grid, while the outside ends wrap-around and connect to each other, thereby forming the 2D torus. The SMP system 100 further comprises a plurality of I/O subsystems 106. I/O traffic enters the processor modules 102 of the 2D torus via the I/O ports. Although only one I/O subsystem 106 is shown connected to each processor module 102, because each processor module 102 has two I/O ports, any given processor module 102 may be connected to two I/O subsystems 106 (i.e., each processor 104 may be connected to its own I/O subsystem 106).

Figure 2:
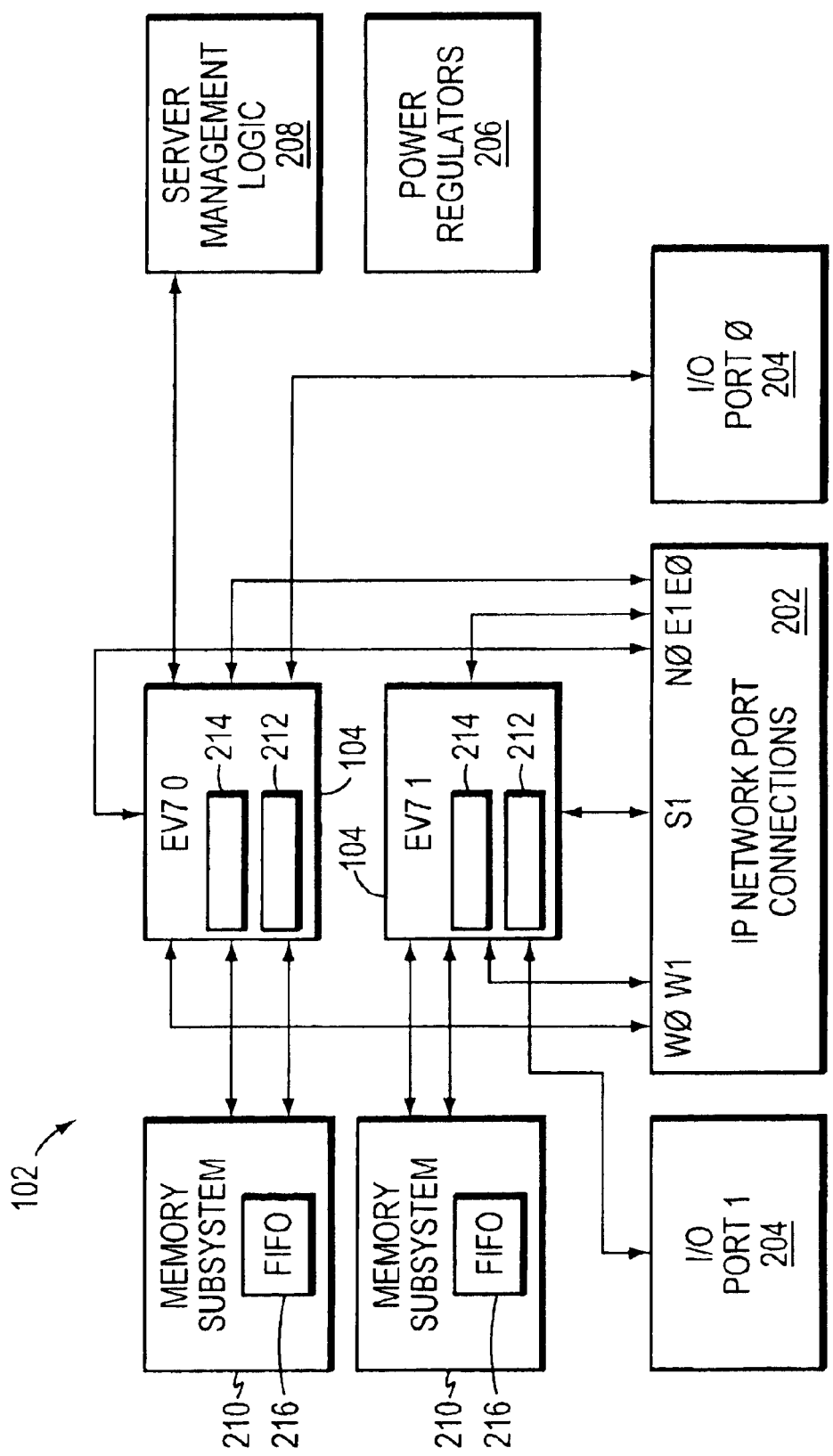
FIG. 2 is a schematic block diagram of a dual processor module of the computer system of FIG. 1.

FIG. 2 is a schematic block diagram of a dual CPU (2P) module 102. As noted, each 2P module 102 preferably has two CPUs 104 each having connections 202 for the IP ("compass") network ports and an I/O port 204. The 2P module 102 also includes one or more power regulators 206, server management logic 208 and two memory subsystems 210 each coupled to a respective memory port (one for each CPU 104). The server management logic 208 cooperates with a server management system to control functions of the computer system 100 (FIG. 1), while the power regulators 206 control the flow of electrical power to the 2P module 102. Each of the N, S, E and W compass points along with the I/O and memory ports, moreover, preferably use clock-forwarding, i.e., forwarding clock signals with the data signals, to increase data transfer rates and reduce skew between the clock and data.

Each CPU 104 of a 2P module 102 is preferably an "EV7" processor from Compaq Computer Corp. of Houston, Tex., that includes part of an "EV6" processor as its core together with "wrapper" circuitry that comprises two memory controllers, an I/O interface and four network ports. In the illustrative embodiment, the EV7 address space is 44 physical address bits and supports up to 256 processors 104 and 256 I/O subsystems 106. The EV6 core preferably incorporates a traditional reduced instruction set computer (RISC) load/store architecture. In the illustrative embodiment described herein, the EV6 core is an Alpha® 21264 processor chip manufactured by Compaq Computer Corporation, with the addition of a 1.75 megabyte (MB) 7-way associative internal cache and "CBOX", the latter providing integrated cache controller functions to the EV7 processor. The EV7 processor also includes an "RBOX" that provides integrated routing/networking control functions with respect to the compass points, and a "ZBOX" that provides integrated memory controller functions for controlling the memory subsystem 370. However, it will be apparent to those skilled in the art that other types of processor chips may be advantageously used.

Each CPU 104 of the multiprocessor system 100 also includes a plurality of internal control and status registers (CSRs). Specifically, each CPU is configured to include an interrupt queue register 212 and an interrupt request register 214. As described herein, the interrupt queue register 212 has a plurality of entries, e.g., two, for buffering interrupt information received by the respective CPU 104. The interrupt request register 214 has a plurality of bit positions, and different bits (or segments of bits) are associated with different interrupt priority levels.

Each memory subsystem 210 may be and/or may include one or more conventional or commercially available dynamic random access memory (DRAM), synchronous DRAM (SDRAM), double data rate SDRAM (DDR-SDRAM) or Rambus DRAM (RDRAM) memory devices. One or more of the memory subsystems 210 is preferably configured to include at least one memory structure, such as a First In First Out (FIFO) queue 216.

Figure 3:
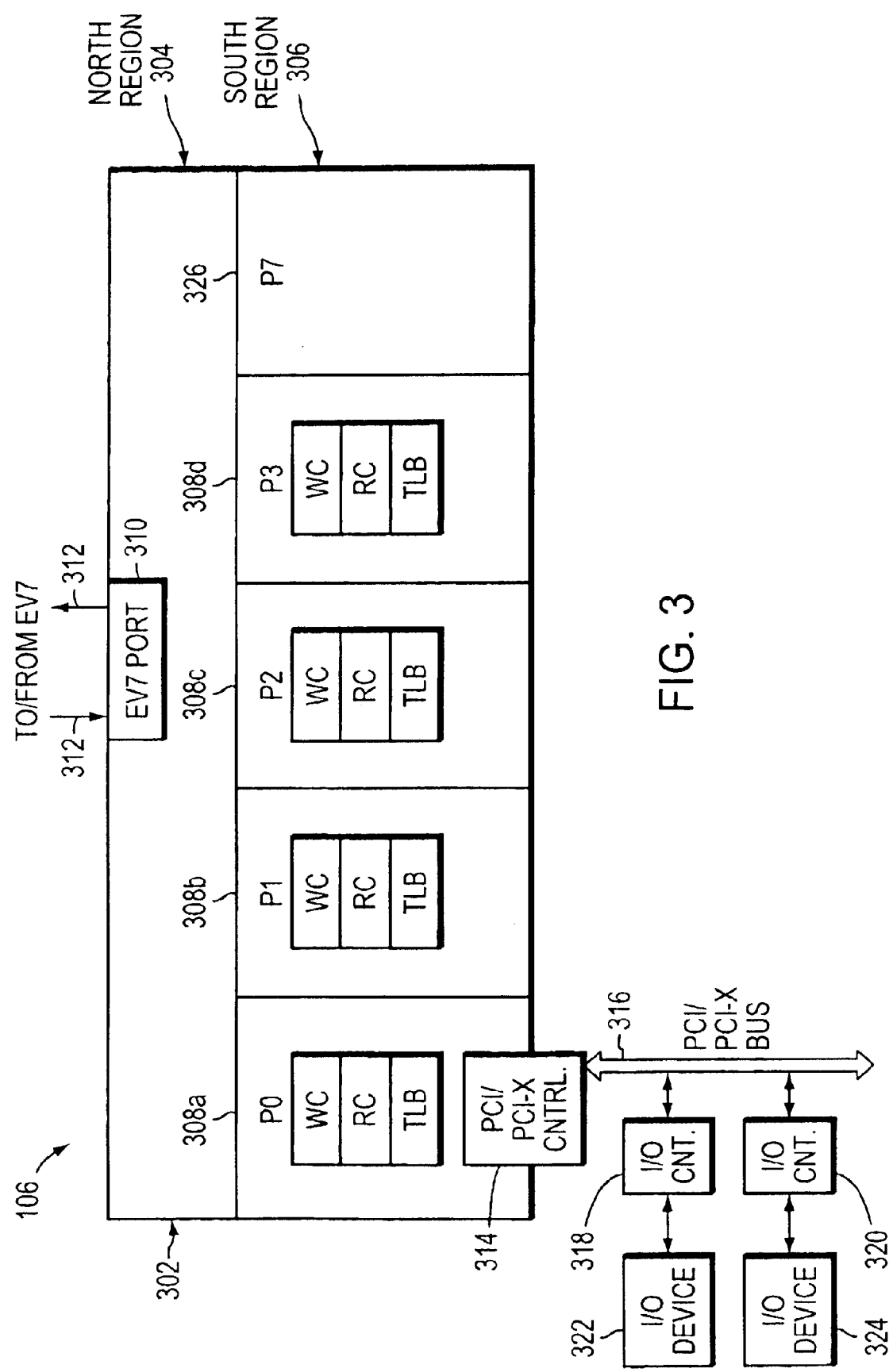
FIG. 3 is a schematic block diagram of an I/O subsystem of the computer system of FIG. 1.

FIG. 3 is a schematic block diagram of an I/O subsystem 106. The subsystem 106 includes an I/O bridge 302, which may be referred to as an "IO7", that constitutes a fundamental building block of the I/O subsystem 106. The IO7 302 is preferably implemented as an application specific integrated circuit (ASIC). As described above, each EV7 processor 104 includes one I/O port 204; however, there is no requirement that each processor 104 be connected to an I/O subsystem 106.

The IO7 302 comprises a North circuit region 304 that interfaces to the EV7 processor 104 and a South circuit region 306 that includes a plurality of I/O ports 308a–d (P0–P3) that preferably interface to standard I/O buses. An EV7 port 310 of the North region 304 couples to the EV7 processor 104 via two unidirectional, clock forwarded links 312. In the illustrative embodiment, three of the four I/O ports 308a–c interface to the well-known Peripheral Component Interface (PCI) and/or PCI-Extended (PCI-X) bus standards, while the fourth port 304d interfaces to an Accelerated Graphics Port (AGP) bus standard. More specifically, ports P0–P2 include a PCI and/or PCI-X controller, such as controller 314 at port P0, which is coupled to and controls a respective PCI and/or PCI-X bus, such as bus 316. Attached to bus 316 may be one or more I/O controller cards, such as controllers 318, 320. Each I/O controller 318, 320, in turn, interfaces to and is responsible for one or more I/O devices, such as I/O devices 322 and 324. Port P3 may include an AGP controller (not shown) rather than a PCI or PCI-X controller for controlling an AGP bus.

A cache coherent domain of the SMP system 100 preferably extends into the IO7 302 and, in particular, to I/O buffers or caches located within each I/O data port 308 of the IO7 302. Specifically, the cache coherent domain extends to a write cache (WC), a read cache (RC) and a translation look-aside buffer (TLB) located within each I/O data port 308. The WC and RC, as well as TLB function as coherent buffers.

In the preferred embodiment, South region 306 further includes an interrupt port 326 (P7). The interrupt port P7 collects PCI and/or AGP level sensitive interrupts (LSIs) and message signaled interrupts (MSIs) generated by or within the other south ports P0–P3, such as by I/O devices 322 and 324. The interrupt port P7 may also collect interrupts generated by one or more processors of the EV7 mesh. These interrupts are sent to North region 306 for transmission to and servicing by the processors 104 of the EV7 mesh. The interrupt port P7 also collects errors generated within the North and South regions 304, 306 of the IO7.

A multiplexer (MUX) (not shown) receives inputs from each of the south ports P0–P3 and P7 and provides a single output to North region 304. Thus, messages generated within any of the south ports P0–P3 and P7 are received by and processed by the MUX before transmission to North region 304 and the EV7 mesh. The MUX may include an up hose arbitration (arb) logic circuit.

Figure 4:
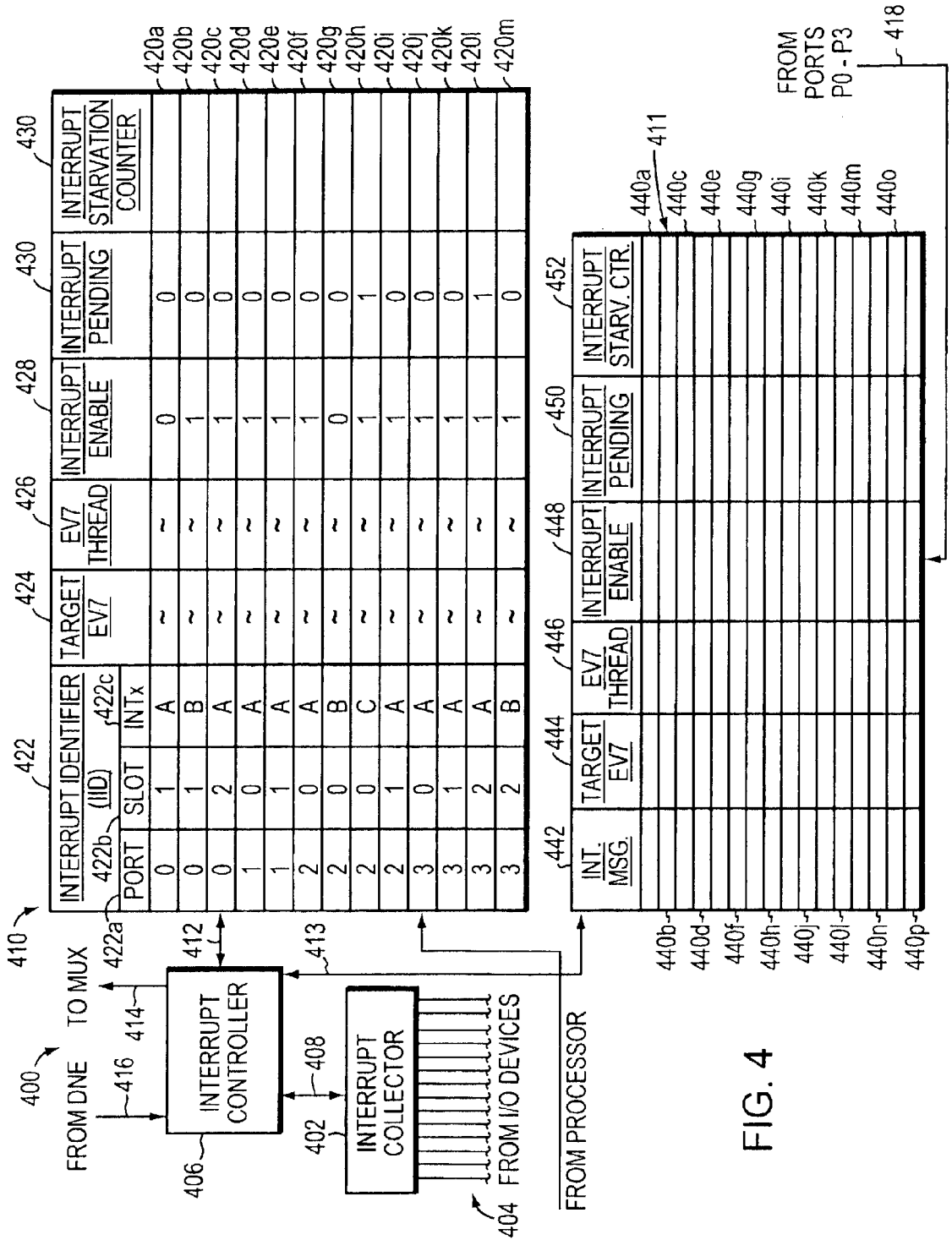
FIG. 4 is a highly schematic block diagram of an interrupt control system in accordance with the present invention.

FIG. 4 is a schematic block diagram of a preferred interrupt control system 400 which may advantageously be disposed, at least in part, at the interrupt port P7 of an IO7 302. The interrupt control system 400 includes an interrupt collector 402 having a plurality of interrupt wires or lines 404 for receiving interrupt signals, such as level sensitive interrupts (LSIs) and/or message signaled interrupts (MSIs), from the I/O devices that may be coupled to the respective IO7 302 and from selected processors of the EV7 mesh. Operatively coupled to the interrupt collector 402 is an interrupt controller 406. The interrupt controller 406 is preferably programmed to periodically poll the interrupt collector 402 to determine which lines or wires 404 are asserted, and to retrieve that information, as indicated by arrow 408. The interrupt controller 406 also has access to a LSI register file 410 and a MSI register file 411. As described below, the interrupt controller 406 can read from and write to the LSI register file 410, as indicated by arrow 412, and to the MSI register file 411, as indicated by arrow 413.

It should be understood that more than one I/O device may be connected to a given wire or line 404 leading into the interrupt collector 402.

The interrupt controller 406 is also configured to generate interrupt messages or transactions, such as Write Internal Processor Register (WrIPR) messages or transactions, and send them to the MUX for transmission, via the IO7's North region 304, to the EV7 mesh, as indicated by arrow 414. The interrupt controller 406 can also receive messages from the EV7 mesh as indicated by arrow 416. In addition, the interrupt controller 406 may receive messages from the other ports P0–P3 of the IO7 or from the processors of the EV7 through CSR write transactions, as indicated by arrow 418.

The LSI register file 410 is preferably arranged, at least logically, as a table array having a plurality of columns and rows whose intersections define corresponding cells for storing information. In particular, the LSI register file 410 has a plurality of rows 420a–m, and each row 420a–m of the register file preferably corresponds to a wire or line 404 leading into the interrupt collector 402. The LSI register file 410 also has a plurality of columns for organizing information associated with each row 420a–m. Specifically, the LSI register file 410 has a first column 422 that contains a unique number for each row 420a–m. The interrupt number 422 may comprise three parts: a port ID 422a, a slot ID 422b and an interrupt designator (INTx) 422c. A second column 424 contains a target EV7 processor 104 that is to process the interrupt service routine of the interrupt identified by the respective row 420a–m. A third column 426 contains the thread of the EV7 processor 104 that is to process the interrupt service routine. A fourth column 428 indicates whether the interrupt of the respective row 420a–m is enabled or disabled. For example, the fourth column may be 1-bit. If the bit is asserted (e.g., set to "1") the respective interrupt is enabled. If the bit is de-asserted (e.g., set to "0"), the interrupt is disabled. A fifth column 430 indicates whether the respective interrupt is pending. Fifth column 430 may also be 1-bit and if asserted indicate that the interrupt is pending and if de-asserted indicate that the interrupt is not pending. A sixth column 432 constitutes or otherwise contains an interrupt starvation counter. As described below, the interrupt starvation counter 432 is used to prevent particular interrupts from becoming starved.

The MSI register file 411 is also preferably arranged, at least logically, as a table array having a plurality of rows and columns whose intersections define cells or entries for storing data. Specifically, the MSI register file 411 has a plurality, e.g., 16, rows 440a–p, and each row corresponds to a MSI generating device. The MSI register file 411 also has a plurality of columns for organizing information associated with the rows. Specifically, the MSI register file 411 has an interrupt message (int. msg.) column 442, a target EV7 column 444, an EV7 thread column 446, an interrupt enabled column 448, an interrupt pending column 450, and an interrupt starvation counter column 452. The interrupt message column 442 basically identifies the respective MSI generating device. Columns 444, 446 and 448 are similar to columns 424, 426 and 428 of the LSI file 410. Interrupt pending column 450 is preferably 32-bits wide and each bit corresponds to and thus identifies one of the 32 unique MSIs that can be generated by the respective device. The interrupt starvation counter 452 is similar to counter 432 of the LSI file 410.

Processor initiated interrupts can also be managed by the interrupt controller 406 of port P7. For example, a processor 104 may issue a programmed IO (PIO) transaction for writing to one or more fields of the LSI register file 410, such as the interrupt pending column 430. The interrupt controller 406 responds to the interrupt caused by the PIO transaction in the same way as if the interrupt came from an I/O device. It should be understood that the LSI and/or MSI register files 410, 410 may be implemented through one or more CSRs configured at the IO7. In this case, a processor 104 may trigger an interrupt by issuing a write transaction to a respective IO7 CSR.

Figure 5A:
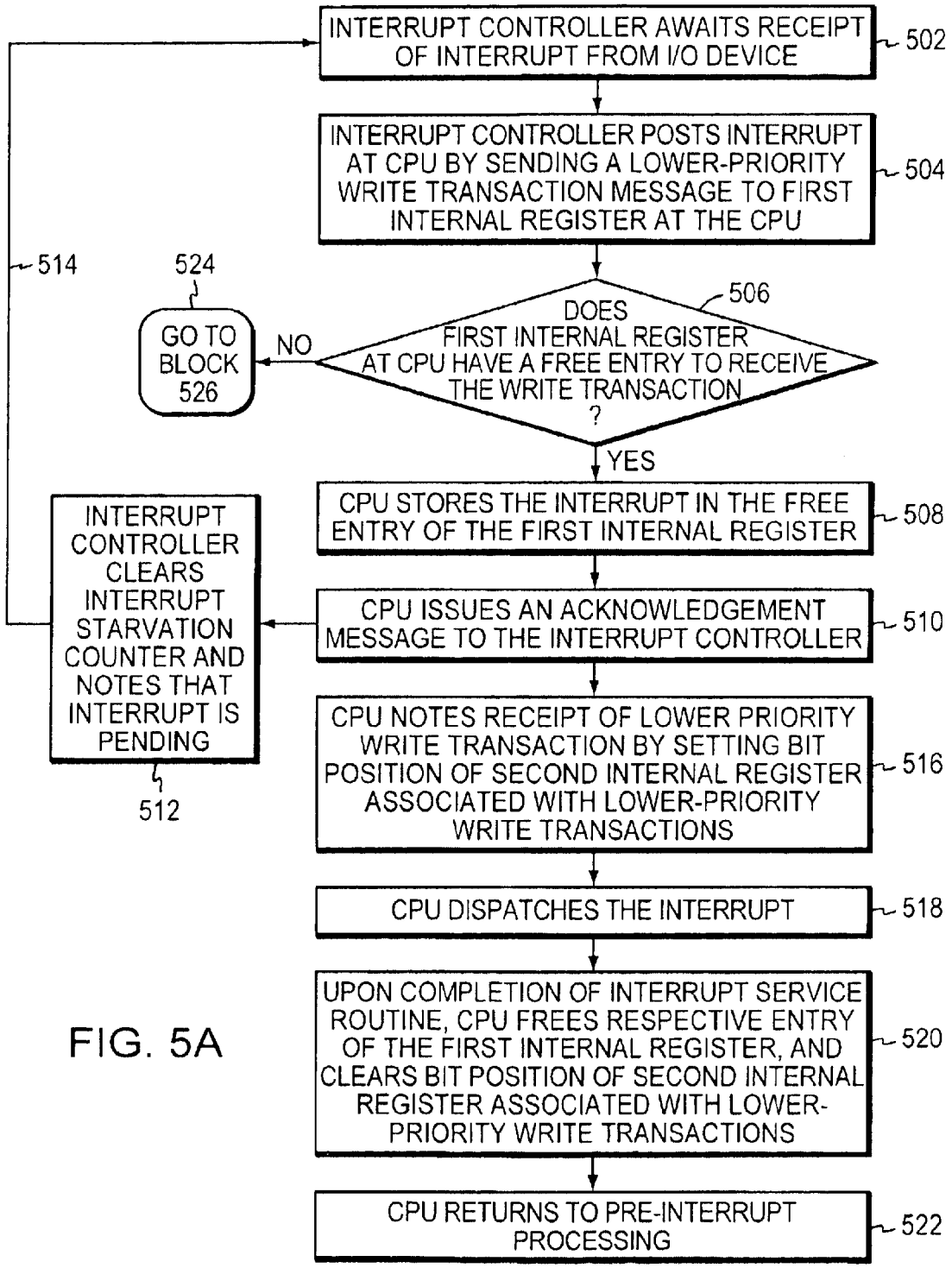
FIGS. 5A–B are a flow diagram of the method of the present invention.
Figure 5B:
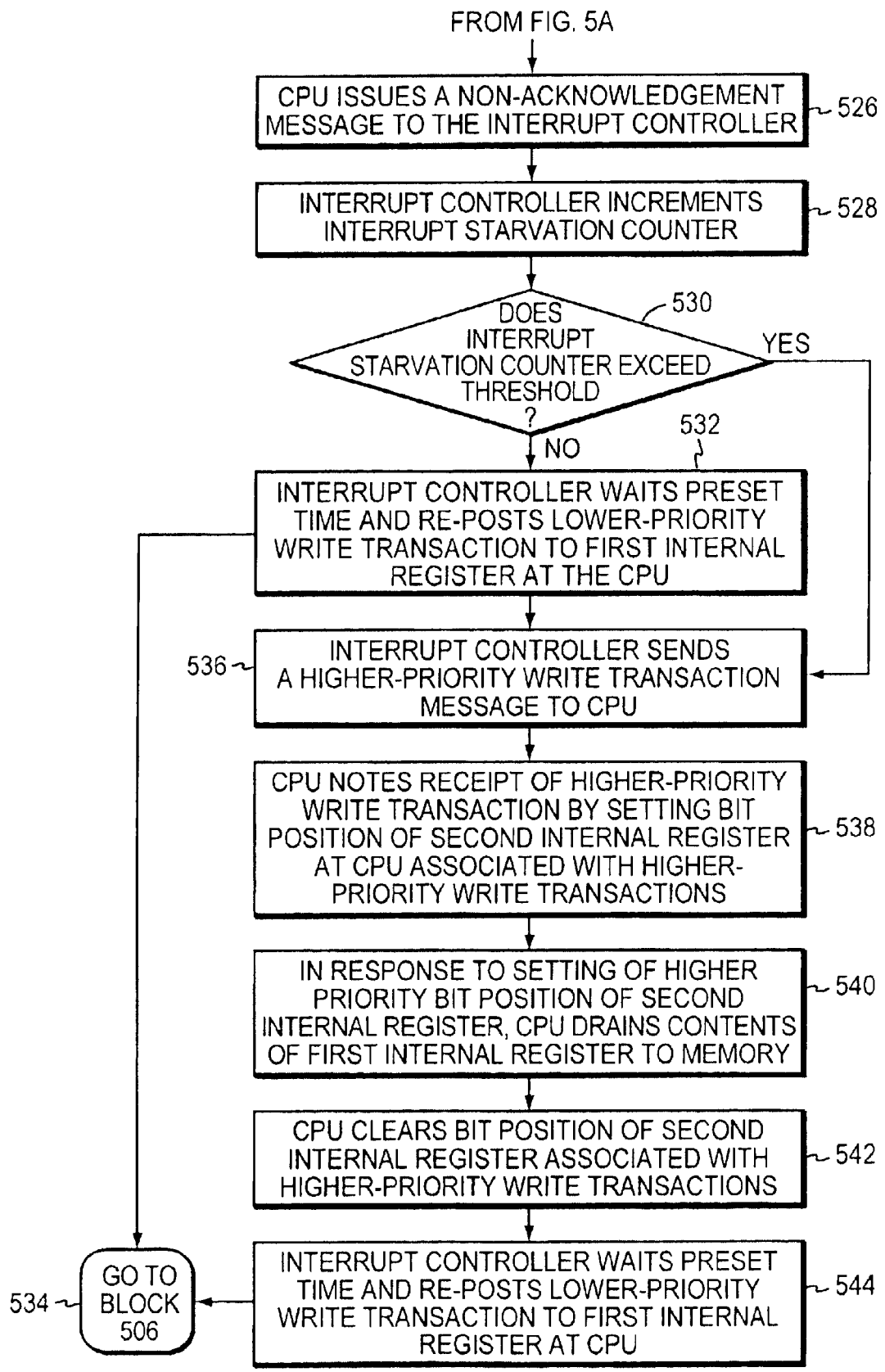

FIGS. 5A and 5B is a flow diagram of the method of the present invention. Initially, the interrupt controller 406 (FIG. 4) is in an idle or wait state waiting to receive an interrupt, as indicated at block 502. Suppose I/O device 324 at port P0 (FIG. 3) of the IO7 302 requires some type of service from the EV7 mesh. The I/O device 324 preferably signals a level sensitive interrupt (LSI) by setting the signal of its wire or line 404 (FIG. 4) leading to the interrupt collector 402 to the specified LSI level. Alternatively, I/O device 324 may issue a message signaled interrupt (MSI). During the next polling cycle, the interrupt controller 406 will "see" that a signal is present on a given line 404. The levels of the wires or lines 404 may be captured by the interrupt collector 402 and moved to the interrupt controller 406 by one or more shift operations, utilizing one or more shift registers. In response, the interrupt controller 406 indexes to the appropriate entry or row, e.g., row 420h, of the LSI register file 410, which, as described herein, controls how the LSIs are processed. The controller 406 may first determine whether this particular interrupt is enabled by examining the corresponding entry from the interrupt enabled column 428 for row 420h. If the interrupt is not enabled, the interrupt controller 406 ignores the interrupt. Assuming the interrupt is enabled, the interrupt controller 406 next examines the corresponding entry from the interrupt pending column 430 for entry 420h. This entry should be "0", unless some other I/O device connected to this same wire or line 404 already has an interrupt outstanding.

The interrupt controller 406 then proceeds to post the interrupt from I/O device 324 (or from the processor if this were a processor initiated interrupt) to the EV7 mesh, as indicated at block 504. Specifically, the interrupt controller 406 generates a write message, such as a WrIPR message, that is directed to the interrupt queue register 212 at the EV7 processor 104 that is to service this interrupt. The interrupt controller 406 identifies the appropriate target processor from the respective entry at the target EV7 column 424 for row 420*h*. Appended to the WrIPR is an interrupt identifier (IID), which the interrupt controller 406 generates by concatenating the following information:

| Interrupt Number | EV7 Thread | IO7 ID |
|---|---|---|

The interrupt number and EV7 thread are obtained from columns 422 and 424 of the LSI register file 410 for entry 420*h*. The interrupt controller 406 may be preconfigured with or otherwise have access to the ID of the IO7.

The interrupt controller 406 sends the message by passing it, via the MUX, into the North region 304 from where it is sent via link 314 into the EV7 mesh. Within the EV7 mesh, the message is routed to the target processor 104 by means of the interprocessor (IP) network ports 202 of the various processors. Upon receiving the WrIPR message from the interrupt controller 406, the target processor 104 determines whether its interrupt queue register 212 has a free entry for receiving the WrIPR message, as indicated at decision block 506.

Figure 6:
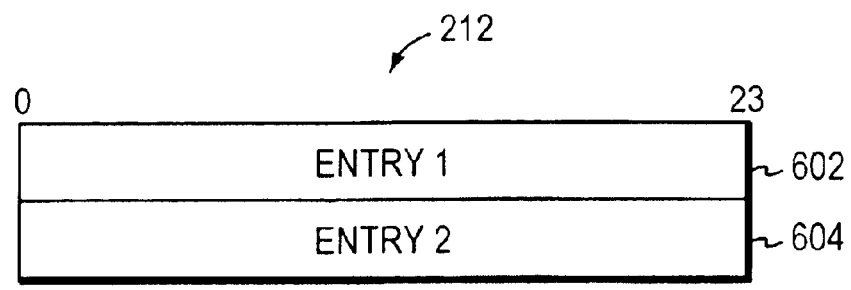
FIGS. 6 and 7 are highly schematic block diagrams of registers configured in accordance with the present invention.

FIG. 6 is a highly schematic block diagram of an interrupt queue register 212. Register 212 preferably has two entries 602 and 604 each of which can store a respective interrupt. In the preferred embodiment, each entry 602 and 604 is 24-bits in length, which is sufficient to store the IID of the WrIPR message. The register 212 is preferably configured as a first-in-first-out (FIFO) queue.

If the interrupt queue register 212 has a free entry, e.g., entry 604, the EV7 processor 104 loads the IID of the WrIPR message into the free entry 604, as indicated at block 508. The EV7 processor 104 then issues an acknowledgment message, such as a Write Input/Output Acknowledgment (WrIOAck) message, to the IO7 302 to acknowledge its receipt of the interrupt, as indicated at block 510.

If a WrIOAck is received from the target EV7 processor 104, the interrupt controller 406 responds by clearing (e.g., setting to null or zero) the interrupt starvation counter 432 for row 420*h*, as indicated at block 512. The interrupt controller 406 also asserts the interrupt pending entry 430 for row 420*h* to reflect that the respective interrupt is pending service, as also indicated at block 512. As indicated by arrow 514, the interrupt controller 406 then returns to the wait state 502.

After receiving and successfully storing the interrupt in its interrupt queue register 212, the EV7 processor 104 next notes the receipt of an interrupt by setting the bit or bits of its interrupt request register 214 that are associated with a low priority interrupt, as indicated at block 516.

Figure 7:
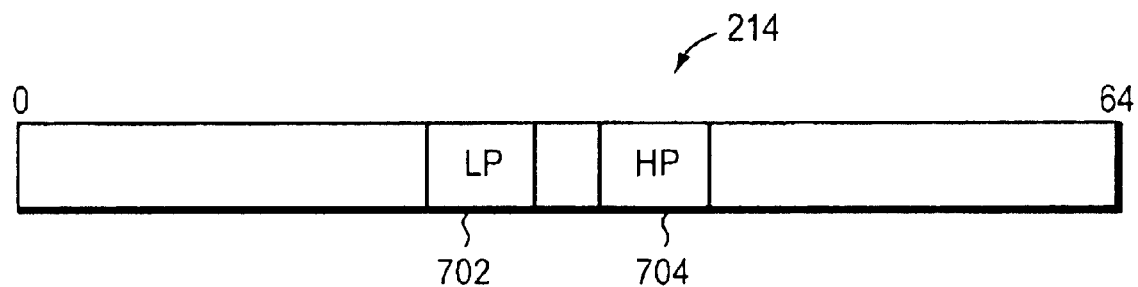

FIG. 7 is a highly schematic block diagram of an interrupt request register 214. Register 214 has a plurality of bits, e.g., 64-bits, and different bits are associated with different interrupt priority levels. Specifically, there are six interrupt wires leading into the EV6 core of the processor 104. Each wire, moreover, is associated with a different priority level, and is thus serviced in a different order by the processor 104. In particular, higher priority interrupts are serviced before lower priority interrupts. The interrupt request register 214 is preferably organized to have six segments, and each of these segments is associated with a different one of the interrupt wires leading into the EV6 core. Included within these six segments, are a low-priority (LP) device interrupt segment 702, and a high-priority (HP) device interrupt segment 704. Each segment is about 10-bits and all of the bits in each segment are logically OR-ed together to determine whether the corresponding interrupt wire should be asserted. Accordingly, the setting of a bit of the LP bit segment 702 causes a low-priority interrupt wire leading into the EV6 core to be asserted, while the setting of a bit of the HP bit segment 704 causes a high-priority interrupt wire leading into the EV6 core to be asserted.

The EV7 processor 104 sets one or more of the bits of the LP segment 702 in response to having successfully stored an interrupt contained in a WrIPR message transaction directed to its interrupt queue register 212. As indicated above, setting of the LP segment 702 causes the respective interrupt wire into the EV6 core to be asserted. In response, the EV7 processor retrieves the interrupt from register 212 and services, e.g., discharges, that interrupt, as indicated at block 518. To process the interrupt, the EV7 processor 104 preferably obtains the appropriate interrupt vector by using the IID as an index, and executes the corresponding interrupt service routine. Since the register 212 is organized as a FIFO queue, if two interrupts are present, the EV7 processor 104 discharges the older of the two.

Upon completion of the interrupt service routine, the processor 104 frees the respective entry of the interrupt queue register 212, e.g., entry 604, so that it may receive a new interrupt, as indicated at block 520. The processor 104 also clears the low-priority bit segment 702 of the interrupt request register 214 to reflect that the interrupt has been serviced, as also indicated at block 520. In addition, the EV7 processor 104 may issue a programmed IO (PIO) transaction or command to the I/O device informing it that the EV7 has serviced the interrupt, and may issue a write command to the LSI register file 410. The write command instructs the interrupt controller 406 to de-assert the interrupt pending entry of column 430 for row 420*h*. The processor 104 then typically returns to the particular task or processing thread it was performing before the interrupt came in, as indicated at block 522.

As indicated above, the interrupt queue register 212 at the EV7 processor 104 has limited resources for storing interrupts. In particular, it can hold only two IIDs. If the EV7 processor 104 receives a WrIPR message, and register 214 is full, the determination at decision block 506 is No, and, as indicated by Go To block 524, processing moves to block 526 (FIG. 5B). Here, the processor 104 returns a non-acknowledgment (NACK) message, such as a Write Input/Output Non-Acknowledgment (WrIONAck) message, to the IO7 302 that sourced the interrupt, reporting that the interrupt was not accepted, as indicated at block 526. In response to receiving a WrIONAck message, the interrupt controller 406 increments the Interrupt Starvation Counter 432 for the respective row 420, as indicated at block 528, and does not assert the Interrupt Pending entry 428. The interrupt controller 406 then determines whether the value of the interrupt starvation counter 432, as incremented, exceeds a predetermined threshold, as indicated at decision block 530. If not, the interrupt controller 406 waits a predetermined amount of time (e.g., a set number of clock cycles) and re-issues the WrIPR interrupt message to the target processor's interrupt queue register 212, as indicated at block 532. As indicated by Go To block 534, processing then returns to decision block 506 (FIG. 5A). That is, the processor 104 determines whether a free entry now exits at the interrupt queue register 212 for storing the reposted interrupt. If so, the steps of blocks 508–522 are performed as described above. If not, another WrIONAck message is sent to the interrupt controller which again increments the interrupt starvation counter, as indicated by blocks 526 and 528.

Again, the interrupt controller 406 determines whether the interrupt starvation counter exceeds the predetermined threshold, as indicated at decision block 530. If the interrupt starvation counter exceeds the threshold, the interrupt controller 406 preferably posts an interrupt starvation event. Specifically, the interrupt controller 406 effectively issues a write transaction to the target EV7 processor 104 that has a higher priority than the prior interrupt messages, as indicated at block 536. In the preferred embodiment, the issuance of a higher priority write transaction is achieved by generating and sending a WrIPR message directed to the processor's interrupt request register 214, rather than to the processor's interrupt queue register 212. The WrIPR message directed to the interrupt request register 214, moreover, sets the high priority segment 704 of the register 214, while leaving the rest of the interrupt request register 214 unchanged. For example, register 214 may be configured such that the writing a first bit, e.g., segment 704, does not clear the other register bits. Alternatively, the WrIPR message may include a mask so that execution of the write only results in the contents of the high priority segment 704 being modified.

The EV7 processor 104 notes the receipt of this high priority write transaction and executes the write thereby setting the high priority segment 704 of the interrupt request register 214, as indicated at block 538. As indicated above, the high priority segment 704 of register 214 is associated with an interrupt wire leading into the EV6 core that has a higher priority than the wire associated with the low priority segment 702. In response to the WrIPR message writing to the high priority segment 704 of register 214, Privileged Architecture Library (PAL) code operating at the EV7 processor 104 causes the contents of the interrupt queue register 212 to be drained into the FIFO 216 located in the memory subsystem 210, as indicated at block 540. This frees the entries 602, 604 of the low priority register 214 making them available to accept additional interrupts. The order of the interrupts at the interrupt queue register 212 is preferably maintained at the in-memory FIFO 216.

PAL code may then begin reading the interrupts from the in-memory FIFO 216 and dispatching interrupt service routines to service those interrupts.

Once the interrupt queue register 212 has been drained of its contents, the EV7 processor 104 preferably clears the high priority segment 704 of the interrupt request register 214, as indicated at block 542.

After having sent the higher priority WrIPR of the interrupt starvation event, the interrupt controller 406 preferably waits a set time (e.g., the same number of clock cycles separating the lower priority WrIPRs) and reposts the previously NACK-ed WrIPR write message to the processor's interrupt queue register 212, as indicated at block 544. By virtue of Go To block 534, processing then continues at decision block 506 (FIG. 5B) at which the processor 104 determines whether the interrupt queue register 212 has a free entry for storing the interrupt. Since the previous higher priority WrIPR triggered the EV7 processor 104 to drain its interrupt request register 214, there should now be a free entry, e.g., entry 602 and/or 604, to receive the contents of the reposted WrIPR.

As shown, with the present invention, livelock due to a failure to service I/O interrupts is avoided, despite having only limited resources to service those interrupts and the support for a large number of I/O devices. The present invention also avoids the disadvantages that result from using a global stop or suspension signal. Also, with the present invention, the system need not implement complex ordering or tracking schemes for new writes and writes that have been NACK-ed. Furthermore, by configuring the system to send processor initiated interrupts to the IO7 through writes to an IO7 CSR, the present invention provides a mechanism for resolving inter-processor interrupts at the I/O device interrupt priority level.

It should be understood that in response to one or more WrIONAcks, the interrupt controller 406 may alternatively post a different interrupt event to an EV7 identified by the LSI register file 410, which may be the same or a different EV7 processor.

In a preferred embodiment, the threshold of the interrupt starvation counter is set to one. Thus, an interrupt starvation event occurs in response to two consecutive WrIONAck messages from the EV7 processor 104. This threshold, however, is programmable by writing to another internal register (not shown) of the EV7 processor 104 or at the IO7 302. That is, the threshold is determined by the value programmed into this register. The threshold may vary from zero to any value, although the threshold is typically set to a value less than ten. It should be understood that the interrupt starvation counter may alternatively be decremented from some start value down to the threshold. In this embodiment, the counter would be returned to the start value in response to a WrIOAck.

In another embodiment, a third CSR, referred to as the interrupt queue add register (not shown), is established at the processor 104, and the interrupt controller 406 directs its low priority WrIPR write messages containing the IIDs to this register, rather than the interrupt queue register 212. Assuming the interrupt queue register 212 has a free entry, the EV7 processor 104 then transfers the interrupt from this interrupt queue add register into the interrupt queue register 212.

It should be understood that the WrIPR message directed to the interrupt request register 214 may or may not include the IID that was part of the lower priority WrIPRs directed to the interrupt queue register 212.

It should also be understood that writing to the high priority segment 704 of register 214 may alternatively initiate a software alert at the EV7 processor 104, rather than causing the assertion of an interrupt wire or line. In another embodiment, the EV7 processor 104 may periodically "poll" the high priority segment 704 to see if it has been set.

It should be further understood that rather than having a counter for each entry of the LSI table 410, there may be a single interrupt starvation counter that is operated by the interrupt controller 406.

Furthermore, the interrupt controller 406 is preferably configured such that it does not issue a subsequent WrIPR message until a WrIOAck or WrIONAck is received in response to a prior WrIPR message. Also, after receiving a WrIONAck in response to a first interrupt, the interrupt controller 406 typically does not issue a WrIPR message for another interrupt until the first interrupt is accepted by the EV7 processor 104. That is, the interrupt controller 406 keeps sending the same interrupt until it is accepted by an EV7 processor 104. Alternatively, it may be configured to send a different interrupt event when an WrIONack is received.

The foregoing description has been directed to specific embodiments of the present invention. It will be apparent, however, that other variations and modifications may be made to the described embodiments, with the attainment of some or all of their advantages. For example, the present invention could be implemented in single processor computer systems and/or to prevent system entities and/or agents competing for other limited resources besides interrupt registers from becoming livelocked. Therefore, it is the object of the appended claims to cover all such variations and modifications as come within the true spirit and scope of the invention.

What is claimed is:

1. A method for avoiding starvation of interrupts of a computer system, the computer system having at least one processor for servicing the interrupts, a memory subsystem, one or more input/output (I/O) devices configured to issue interrupts and at least one interrupt controller, the method comprising the steps of:

providing an interrupt queue register having a fixed number of entries for storing interrupts to be serviced by the at least one processor;

posting interrupts generated by the one or more I/O devices to the interrupt queue register;

determining whether the interrupt queue register is full and unable to store a given interrupt; and if the interrupt queue register is full, one of waiting a preset time and reposting the given interrupt to the interrupt queue register, and draining the contents of the interrupt queue register into the memory subsystem so that the interrupt queue register can store the given interrupt.

2. The method of claim 1 further comprising the steps of:

if the interrupt queue register has a free entry for storing the given interrupt, sending an acknowledgement message (ACK) to the interrupt controller; and if the interrupt queue register is full and cannot store the given interrupt, sending a non-acknowledgment message (NACK) to the interrupt controller.

3. The method of claim 2 further comprising the steps of:

providing an interrupt starvation counter that is operable by the interrupt controller;

in response to receiving an ACK from the processor, clearing the interrupt starvation counter; and in response to receiving a NACK from the processor, adjusting the interrupt starvation counter.

4. The method of claim 3 wherein the step of adjusting comprises one of incrementing or decrementing the interrupt starvation counter.

5. The method of claim 3 further comprising the steps of:

determining whether the interrupt starvation counter exceeds a threshold; and if the interrupt starvation counter does not exceed the threshold, performing the step of waiting the preset time and reposting the given interrupt to the interrupt queue register.

6. The method of claim 5 further comprising the steps of:

providing an interrupt request register having a plurality of bit positions that are settable to indicate a priority level of an interrupt posted to the processor;

if the interrupt starvation counter exceeds the threshold, setting the interrupt request register with a high priority indication; and in response to the setting of the interrupt request register with the high priority indication, performing the step of draining the contents of the interrupt queue register into the memory subsystem.

7. The method of claim 6 further comprising the step of, in response to the posting of an interrupt to the interrupt queue register, setting the interrupt request register with a low priority indication.

8. The method of claim 7 wherein the interrupt request register includes a first bit segment the setting of which is indicative of a low priority interrupt and a second bit segment the setting of which is indicative of a high priority interrupt.

9. The method of claim 8 wherein each bit segment of the interrupt request register is associated with an interrupt line leading into the processor.

10. The method of claim 6 wherein the contents of the interrupt queue register drained into the memory subsystem are placed in a first-in-first-out (FIFO) queue.

11. The method of claim 10 further comprising the step of servicing the interrupts stored at the FIFO queue.

12. The method of claim 11 wherein the interrupts issued by the I/O devices are one of level sensitive interrupts (LSIs) and message signaled interrupts (MSIs).

13. The method of claim 1 wherein the interrupts issued by the I/O devices are one of level sensitive interrupts (LSIs) and message signaled interrupts (MSIs).

14. The method of claim 1 wherein the step of draining the contents of the interrupt queue register into the memory subsystem is performed by Privileged Architecture Library (PAL) code running at the processor.

15. The method of claim 1 wherein the computer system includes a plurality of processors configured to issue interrupts, and the interrupt controller receives interrupts from one or more selected processors of the computer system and posts such processor initiated interrupts to the interrupt queue of the at least one processor as with the I/O device interrupts.

16. A computer system comprising:

a plurality of input/output (I/O) devices configured to issue interrupts;

at least one processor for servicing the interrupts;

a memory subsystem;

an interrupt controller configured to receive the interrupts from the I/O devices and to post those interrupts to the at least one processor for servicing; and an interrupt queue register for storing the interrupts posted to the at least one processor, wherein upon receiving a newly posted interrupt, the at least one processor determines whether the interrupt queue register is already full and, if so, drains the contents of the interrupt queue register into the memory subsystem.

17. The computer system of claim 16 further comprising an interrupt starvation counter that is operable by the interrupt controller, wherein if the interrupt queue register has a free entry for the new interrupt, sending an acknowledgement (ACK) message from the at least one processor to the interrupt controller, and in response to the ACK, clearing the interrupt starvation counter.

18. The computer system of claim 17 further comprising if the interrupt queue register does not have a free entry for the new interrupt, sending a non-acknowledgement (NACK) message from the at least one processor to the interrupt controller, in response to the NACK, adjusting the interrupt starvation counter, determining whether the interrupt starvation counter exceeds a threshold, if the interrupt starvation counter does not exceed the threshold, waiting a predetermined time and reposting the new interrupt to the at least one processor.

19. The computer system of claim 18 further comprising an interrupt request register having a plurality of bit positions that are settable to indicate a priority level of an interrupt posted to the processor, wherein if the interrupt starvation counter exceeds the threshold, setting the interrupt request register with a high priority indication; and in response to the setting of the interrupt request register with the high priority indication, draining the contents of the interrupt queue register into the memory subsystem.

20. The computer system of claim 16 wherein the computer system has a plurality of processors configured to issue interrupts, and the interrupt controller posts the processor initiated interrupts to the at least one processor for servicing as with the I/O device interrupts.

* * * * *

UNITED STATES PATENT AND TRADEMARK OFFICE
CERTIFICATE OF CORRECTION

| | | |
|---|---|---|
| PATENT NO. | : 6,920,516 B2 | Page 1 of 1 |
| APPLICATION NO. | : 09/944516 | |
| DATED | : July 19, 2005 | |
| INVENTOR(S) | : David W. Hartwell et al. | |

It is certified that error appears in the above-identified patent and that said Letters Patent is hereby corrected as shown below:

In column 1, line 5, below "CROSS-REFERENCE TO RELATED APPLICATIONS" insert -- The present application claims priority from U.S. Provisional Patent Application Serial No. 60/229,830, which was filed on August 31, 2000, by Sam Duncan, David Golden, Darrel Donaldson, Dave Hartwell, Steven Ho, Andrej Kocev, Jeff Willcox and Roger Pannell for a SYMMETRICAL MULTIPROCESSOR COMPUTER SYSTEM and is hereby incorporated by reference in its entirety. --.

In column 1, line 11, delete "MULTIPLEPROCESSOR" and insert -- MULTIPROCESSOR --, therefor.

In column 8, line 27, delete "10" and insert -- IO --, therefor.

Signed and Sealed this

Eighteenth Day of August, 2009

David J. Kappos
*Director of the United States Patent and Trademark Office*